United States Patent [19]
Masuoka

[11] Patent Number: 5,994,179
[45] Date of Patent: Nov. 30, 1999

[54] METHOD OF FABRICATING A MOSFET FEATURING AN EFFECTIVE SUPPRESSION OF REVERSE SHORT-CHANNEL EFFECT

[75] Inventor: Sadaaki Masuoka, Tokyo, Japan

[73] Assignee: NEC Corporation, Tokyo, Japan

[21] Appl. No.: 08/867,020

[22] Filed: Jun. 3, 1997

[30] Foreign Application Priority Data

Jun. 3, 1996 [JP] Japan .................................. 8-140399

[51] Int. Cl.⁶ .............................................. H01L 21/8238
[52] U.S. Cl. ........................... 438/227; 438/183; 438/231
[58] Field of Search ..................................... 438/183, 176, 438/217, 223, 224, 227, 228, 229, 230, 231, 232, 263, 264, 278, 289, 290, 291, 305, 321, 377, 699, 926

[56] References Cited

U.S. PATENT DOCUMENTS

| | | | |
|---|---|---|---|
| 4,745,082 | 5/1988 | Kwok ...................................... | 438/183 |
| 4,782,031 | 11/1988 | Hogio et al. ............................. | 438/183 |
| 4,843,024 | 6/1989 | Ito .......................................... | 438/183 |
| 4,859,618 | 8/1989 | Shikata et al. .......................... | 438/181 |
| 4,956,314 | 9/1990 | Tam et al. ............................... | 438/289 |
| 5,264,382 | 11/1993 | Watanabe ................................ | 438/183 |
| 5,391,510 | 2/1995 | Hsu et al. ............................... | 438/305 |
| 5,576,227 | 11/1996 | Hsu ........................................ | 438/305 |
| 5,856,225 | 1/1999 | Lee et al. ................................ | 438/291 |
| 5,858,843 | 1/1999 | Doyle et al. ............................ | 438/183 |

FOREIGN PATENT DOCUMENTS

| | | |
|---|---|---|
| 50-125680 | 10/1975 | Japan . |
| 51-94784 | 8/1976 | Japan . |
| 3-248433 | 11/1991 | Japan . |
| 4-123439 | 4/1992 | Japan . |
| 5-36917 | 2/1993 | Japan . |
| 5-160396 | 6/1993 | Japan . |

Primary Examiner—Charles L. Bowers
Assistant Examiner—Jack Chen
Attorney, Agent, or Firm—Sughrue, Mion, Zinn, Macpeak & Seas, PLLC

[57] ABSTRACT

In order to suppress a reverse short-channel effect, a plurality of dummy gates, wherein gate electrodes are respectively to be formed, are formed in selective regions on the substrate. Further, the regions wherein first conductive type elements are to be formed are masked. Thereafter, a first conductive type well by ion planting a first conductive type impurity is formed. Further, a second conductive type source and drain region is formed by ion planting a second conductive type impurity. The resist covering the regions, wherein the first conductive type elements are to be formed, are removed. Following this, regions wherein second conductive type elements are to be formed, are masked by a resist. Further, a second conductive type well is formed by ion planting a second conductive type impurity. A first conductive type source and drain region is formed by ion planting a first conductive type impurity. Subsequently, the resist covering the regions wherein the second conductive type elements are to be formed, is removed, after which the source and drain regions are activated. Thereafter, a first layer on the substrate is formed, and the first layer is polished until the surface of each of the dummy gates is exposed. Then, the dummy gates are removed and, regions wherein the first conductive type elements are to be formed are masked. After a first conductive type impurity is implanted, the resist covering the regions wherein the first conductive type elements are to be formed is removed. Further, regions wherein the second conductive type elements are to be formed, are masked. Then, a second conductive type impurity is implanted, after which the resist covering the regions wherein the second conductive type elements are to be formed is removed. Further, a gate oxide layer in each recess is left by removing the dummy gate. Following this, after the substrate is covered with a gate electrode material, the gate electrode material covering the substrate is polished until the first layer is exposed.

26 Claims, 10 Drawing Sheets

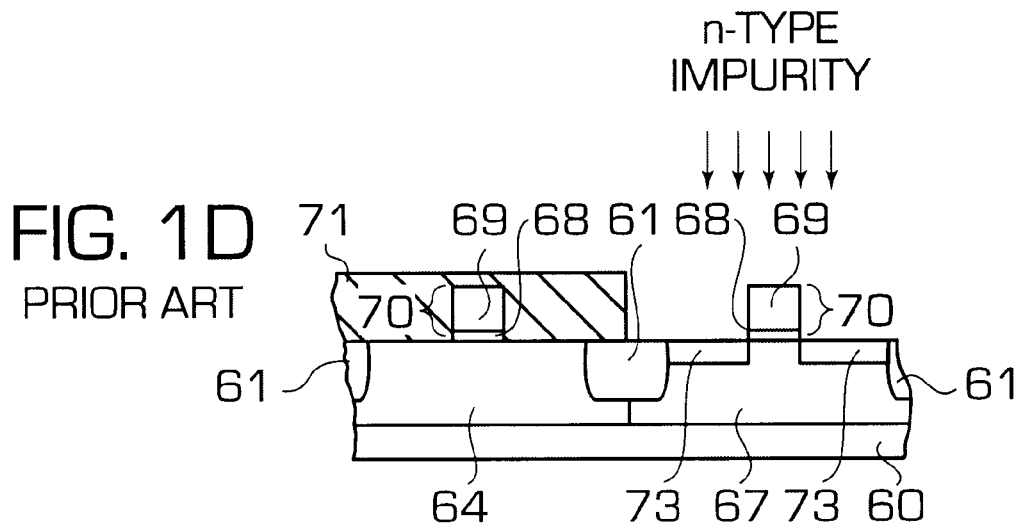
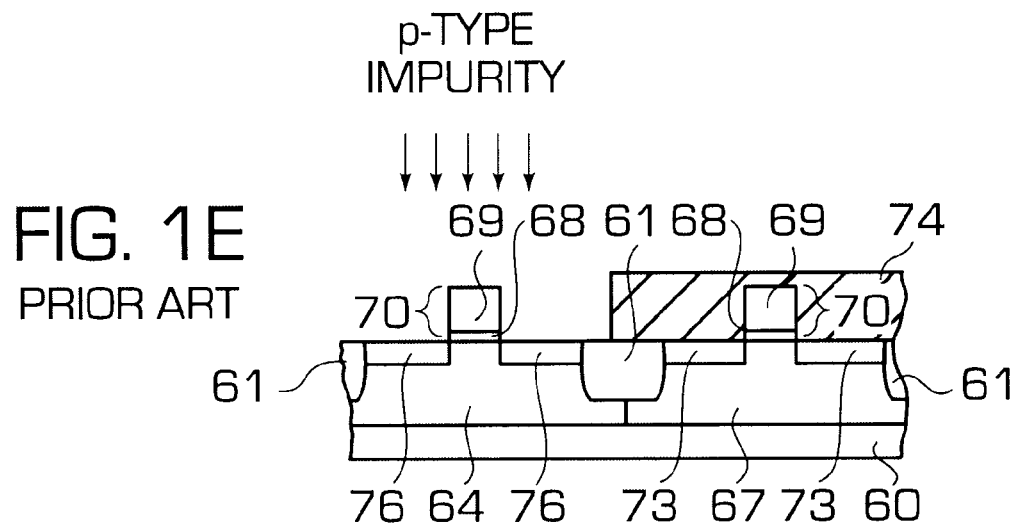

METHOD OF FABRICATING A MOSFET FEATURING AN EFFECTIVE SUPPRESSION OF REVERSE SHORT-CHANNEL EFFECT

BACKGROUND OF THE INVENTION

1. Field of the Invention

The present invention relates generally to a method of fabricating a semiconductor device, and more specifically to a method of fabricating an n-MOSFET (metal-oxide-semiconductor field-effect-transistor) which features an effective suppression of reverse short-channel effects.

2. Description of the Related Art

As is known in the art, one of the most important subjects for MOS devices is a short-channel effect. A threshold voltage is determined by the space charge in a depletion layer formed under a gate electrode. However, in a short channel MOSFET, the charge is reduced because of a charge sharing with the drain field. For this reason, the threshold voltage of a short channel MOSFET is undesirably reduced.

In addition to the above mentioned short-channel effect, as the MOSFET channel length becomes smaller, another undesirable effect which is reverse to the short-channel effect, called a reverse short-channel effect. That is, as the channel length is reduced, the threshold level increases. This reverse short-channel effect will be described later.

Before turning to the present invention, a conventional method of fabricating an n-MOSFET is briefly described with reference to FIGS. 1A–1E, 2A–2B, 3A–F, and 4A–4E.

Referring to FIGS. 1A–1E, processes of fabricating a MOSFET are shown.

As shown in FIG. 1A, a plurality of element isolating regions 61 are formed at predetermined portions of a p-type semiconductor substrate 60. Thereafter, a suitable resist 62 covers a region to which an n-MOSFET is to be formed. Following this, an n-type impurity is ion implanted to the region thereby to form an n-well 64. At the same time, n-type impurities are also ion implanted to the same region to adjust a threshold voltage of. p-MOSFET.

Further, as shown in FIG. 1B, a p-MOSFET forming region is masked using a resist 65, after which a p-type impurity is ion implanted to the region in order to form a p-well 67. At the same time, the p-type impurity is also ion implanted to the p-MOSFET forming region to adjust a threshold voltage of the n-MOSFET.

Subsequently, as shown in FIG. 1C, a gate oxide 68 and a polycrystalline silicon 69 are deposited in this order on the p-type substrate 60, after which gate electrodes 70 are formed using photolithography and etching techniques.

Then, as shown in FIG. 1D, after the n-well 64 is masked with a resist 71, an n-type impurity is ion implanted to the p-type well 67 thereby to form a n-type source-drain region 73. On the contrary, as shown in FIG. 1E, after the p-well 67 is masked with a resist 74, a p-type impurity is ion implanted to the n-type well 64 thereby to form a p-type source-drain region 76. Following this, after the resist 74 is removed, the substrate is annealed in an atmosphere of nitrogen for activating the source-drain regions 73 and 76. The annealing is to repair lattice damage and put dopant atoms on substitutional sites where they will be electrically active.

However, in the processes shown in FIGS. 1A–1E, while the source-drain regions 73 and 76 are subject to heat treatments (viz, annealing) for being activated, point defects in interstitial sites in the source and drain regions are liable to combine with boron ions and diffused in an accelerated manner along the direction of channel. Thus, as the channel length becomes shorter, the concentration of boron immediately below the channel becomes higher. As a result, threshold voltages of MOSFETs become higher. This phenomenon is called a reverse "short-channel" effect.

On the contrary, with MOSFETs, as the channel length is reduced, the depletion layer widths of the source and drain junction become comparable to the channel length, whereby the threshold voltage of the MOS device is lowered (short-channel effect).

In the case where the above mentioned two effects occur at the same time, it is extremely difficult to control the threshold voltage. Therefore, it is highly desirable to effectively suppress the anti-short-channel effect.

One known approach to suppressing the reverse short-channel effect is to implement ion implantation for forming the source-drain regions, which follows the annealing for activation of the source-drain regions. Subsequently, the ion implantation for adjusting the threshold voltage is carried out. Such a known technique is described with reference to FIGS. 2A and 2B.

As shown in FIG. 2A, a gate oxide layer 81 and a gate polysilicon electrode 82 are formed onto a p-type substrate 80 using known techniques. Subsequently, an n-type impurity such as $As^{30}$ is implanted into the substrate 80 thereby to form a source-drain region 84. Thereafter, the substrate 80 undergoes annealing at 1000° C. for 10 seconds. Following this, as shown in FIG. 2B, an p-type impurity such as $B^{30}$ is implanted, via the gate polysilicon electrode 82 and the gate oxide layer 81, into the substrate 80 thereby to adjust a threshold voltage.

With the conventional technique shown in FIGS. 2A and 2B, the ion implantation for adjusting the threshold voltage is implemented after annealing the source-drain region 84 and thus, the reverse short-channel effect is able to be suppressed. However, in order to adjust the threshold voltage, the dopant is implanted through the gate oxide 81 into the substrate. Therefore, this prior technique suffers from the problem that the reliability of the gate oxide 81 is undesirably degraded.

In order to overcome the difficulty inherent in the second prior technique, it is necessary to form the gate oxide layer after the processes of the annealing and the ion implantation for adjusting the threshold voltage. Such a known technique, disclosed in Japanese Laid-open patent application No. 4123439. This third prior art however suffers from the problem in that when an oxide is formed on source and drain regions, the substrate is exposed to aluminum. Therefore, the aluminum forms an energy level which deteriorates the characteristics of the device. Further, an $SiO_2$ film of this prior art is grown in a liquid phase and thus the quality of the film is degraded. As a result, in order to solve the above mentioned problems, it is necessary to use using a CVD technique for forming an oxide film on a source and drain region. A prior method using the CVD technique is disclosed in Japanese Laid-open Patent Application No. 4123439. However, this prior art is encountered the difficulty of a large number of fabrication processes.

SUMMARY OF THE INVENTION

It is therefore an object of the present to provide a method of fabricating an IC device which is able to overcome the aforesaid problems inherent in the prior art and which is able to effectively reduce a reverse short-channel effect.

One aspect of the present invention resides in a method of fabricating a semiconductor device, comprising the steps of (a) forming a plurality of element segregation regions of dielectric material on a first conductive type semiconductor substrate; (b) forming a plurality of dummy gates, in selective regions on the substrate, wherein gate electrodes are to be formed, respectively; (c) masking, by a resist, regions wherein first conductive type elements are to be formed; (d) forming a first conductive type well by ion planting a first conductive type impurity; (e) forming a second conductive type source and drain region by ion planting a second conductive type impurity; (f) removing the resist covering the regions wherein the first conductive type elements are to be formed; (g) masking, by a resist regions wherein second conductive type elements are to be formed, respectively; (h) forming a second conductive type well by ion planting a second conductive type impurity; (i) forming a first conductive type source and drain region by ion planting a first conductive type impurity; (j) removing the resist covering the regions wherein the second conductive type elements are to be formed; (k) activating the source and drain regions; (l) forming a fist layer on the substrate; (m) polishing the first layer until the surface of each of the dummy gates is exposed; (n) removing the dummy gates; (o) masking, by a resist, regions wherein the first conductive type elements are to be formed, respectively; (p) ion implanting a first conductive type impurity; (q) removing the resist covering the regions wherein the first conductive type elements are to be formed; (r) masking, by a resist, regions wherein the second conductive type elements are to be formed, respectively; (s) ion implanting a second conductive type impurity; (t) removing the resist covering the regions wherein the second conductive type elements are to be formed; (u) forming a gate oxide layer in each recess left by removing the dummy gate in step (n): (v) covering the substrate with a gate electrode material; and (w) polishing the gate electrode material covering the substrate at step (v) until the first layer is exposed.

BRIEF DESCRIPTION OF THE DRAWINGS

The features and advantages of the present invention will become more clearly appreciated the following description taken in conjunction with the accompanying drawings, in which like elements are denoted by like reference numerals and in which:

FIGS. 1A–1E are each a diagram showing 1C device fabrication processes of first prior art;

DETAILED DESCRIPTION OF THE PREFERRED EMBODIMENTS

A first embodiment of the present invention, which is applicable to CMOSFETs, will be described with reference to FIGS. 3A–3J.

Figure 1A:
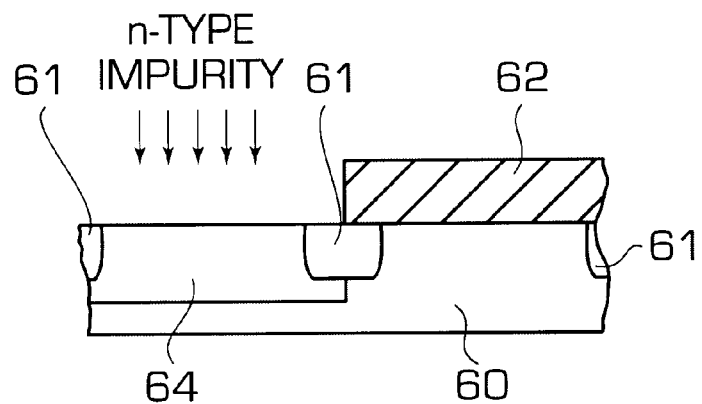
Figure 1B:
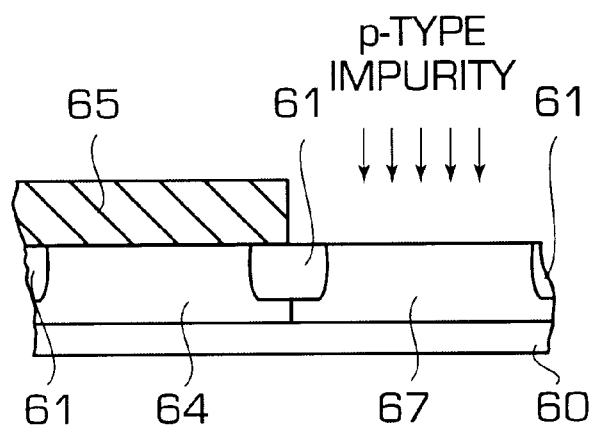
Figure 1C:
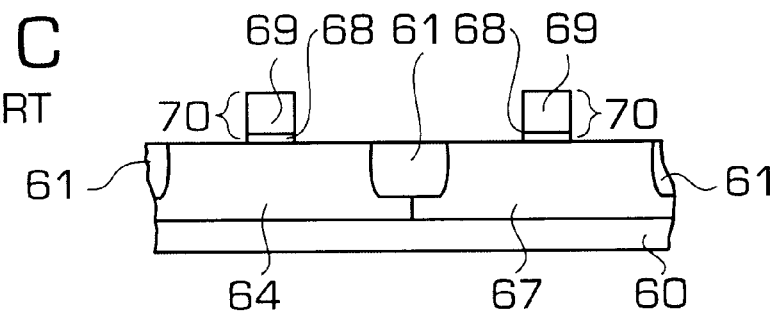
Figure 2A:
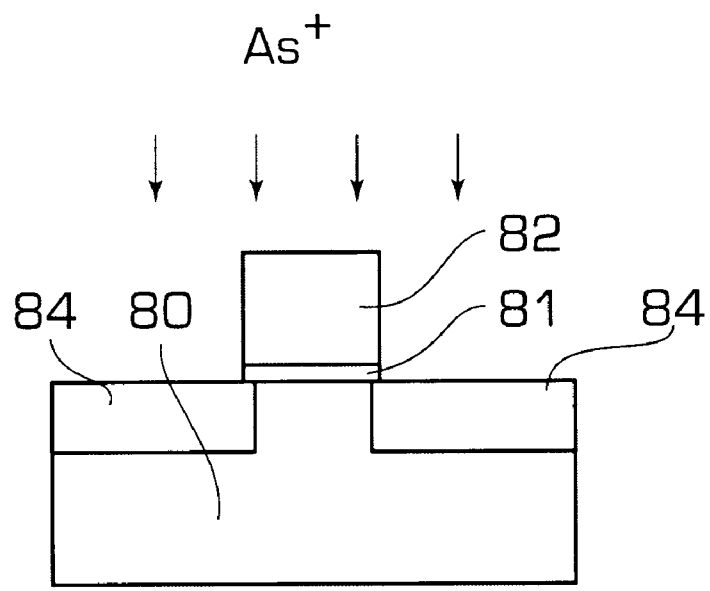
FIGS. 2A and 2B are each a diagram showing 1C device fabrication processes of second prior art.
Figure 2B:
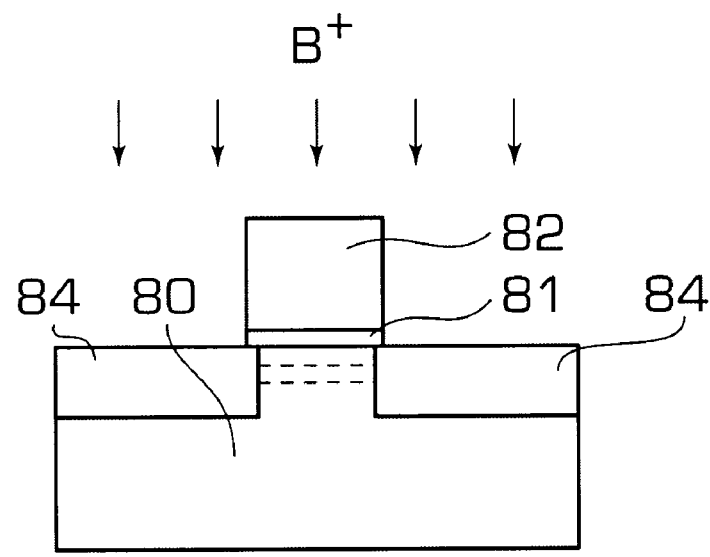
Figure 3A:
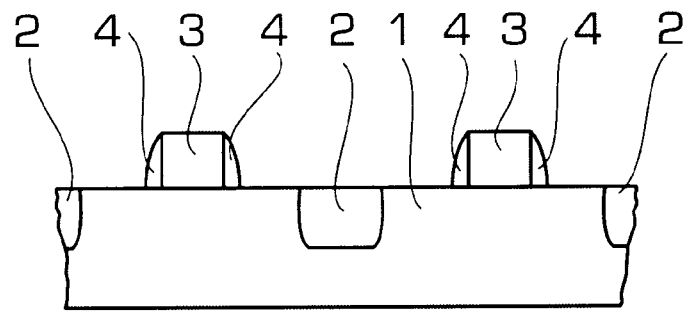
FIGS. 3A–3J are each a diagram showing a series of 1C device fabrication processes according to a first embodiment of the present invention.

As shown in FIG. 3A, a plurality of field oxide regions 2 are formed, on a <100>type silicon substrate I for segregation of adjacent elements. Thereafter, a silicon nitride film with a thickness of about 200 nm is formed on the silicon substrate 1 using a CVD (chemical vapor deposition) technique. Following this, dummy gates 3, each of which is made of silicon nitride and has a shape identical to that of a gate electrode to be formed at a later time, are formed on the substrate 1 through photolithography and etching. Thereafter, a $SiO_2$ layer is deposited on the entire surface and is subjected to anisotropic etching. Thus, sidewalls 4 are formed on the sides of each dummy gate 4. The thickness of the sidewall 4 is about 70nm at the base portion thereof.

Figure 3B:
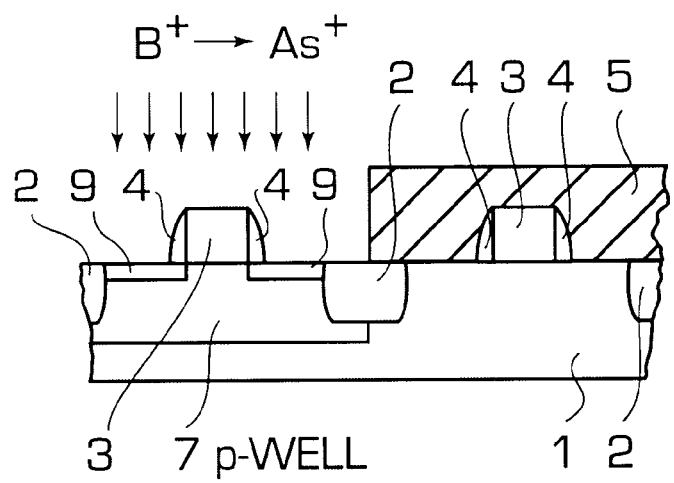

Subsequently, as shown in FIG. 3B, a region where p-type MOSFET is to be formed, is masked by a resist 5. Thereafter, 300 keV $B^+$ions (for example) are implanted at a dose about $2\times10^{13}cm^{-2}$ into the region except for the masked portion in order to form a p-type well 7. Following this, 30 keV $As^+$ions (for example) are implanted at a dose about $3\times10^{15}cm^{-2}$ into the same region, and thus forms a $n^+$-type source and drain region 9.

Following this, after the resist 5 is removed, a region where n-type MOSFET is to be formed is masked by a resist 10. Thereafter, 700 keV $P^+$ions (for example) are implanted at a dose about $1.5\times10^{13}cm^{-2}$ into the region except for the masked portion in order to form a n-type well 12. Subsequently, 20 keV $BF_2^+$ions (for example) are implanted at a dose about $3\times10^{15}cm^{-2}$ into the same region, forming a $n^+$-type source and drain region 14. Subsequently, the resist 10 is removed, after which the substrate 1 is annealed at 1000° C. for about 10 seconds in an atmosphere of nitrogen for activating the $n^+$-type source and drain region 9 as well as the $p^+$-type source and drain region 14. By this annealing, point defects in interstitial sites in the source and drain regions are eliminated.

Figure 3C:
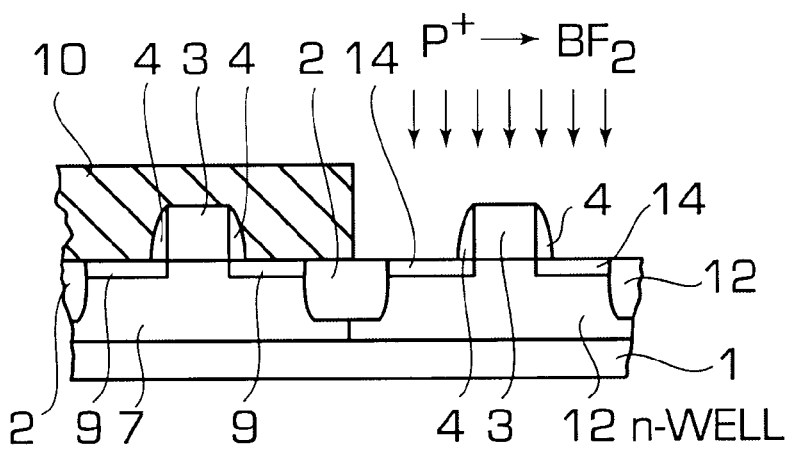
Figure 3D:
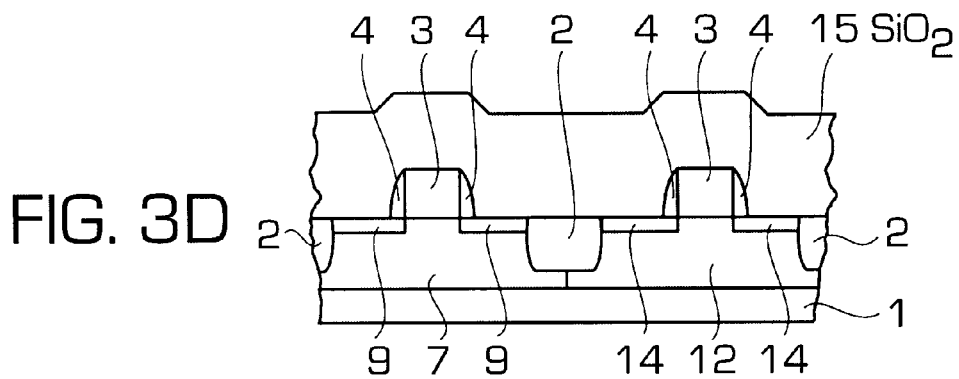
Figure 3E:
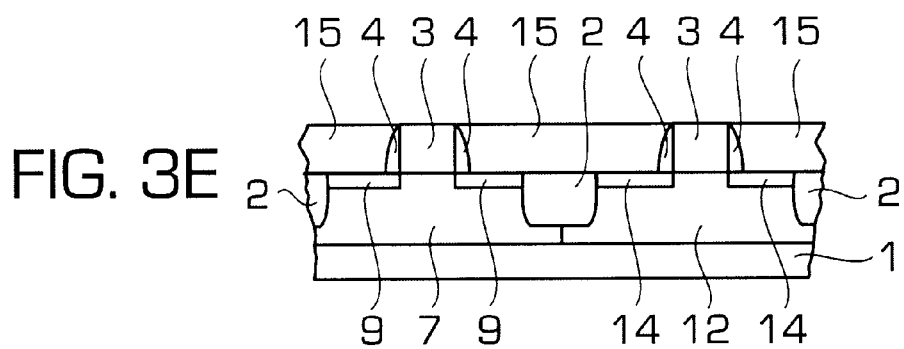
Figure 3F:
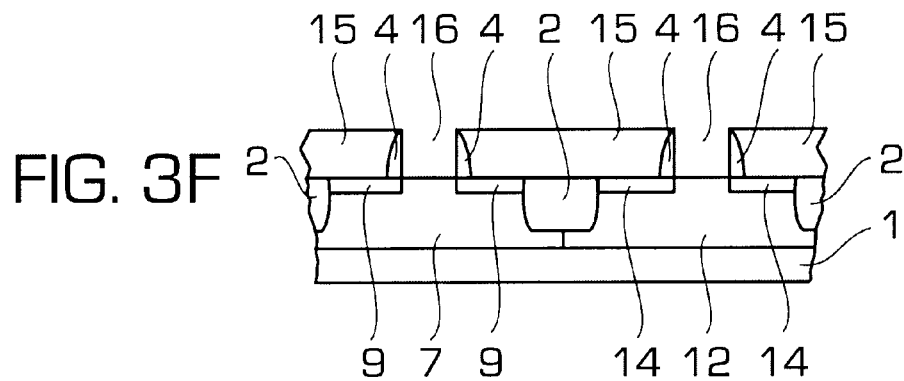

Subsequently, as shown in FIG. 3D, the entire surface of the structure of FIG. 3C is covered with a $SiO_2$. film 15 having a thickness of about 400 nm using CVD technique. Thereafter, as shown in FIG. 3E, the surface of the structure of FIG. 3D is flattened, using chemical mechanical polishing techniques, until the top surface of each of the dummy gates 3 is exposed. Thereafter, as shown in FIG. 3F, the dummy gates 3 of silicon nitride are etched using phosphorus (for example), whereby recesses 16 are formed in which gate electrodes are to be deposited at a later process, respectively.

Figure 3G:
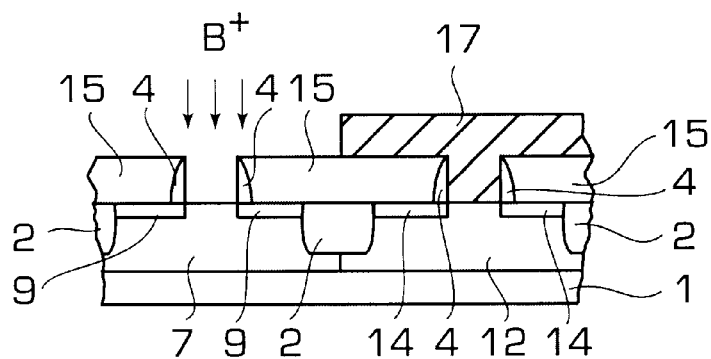

Following this, as shown in FIG. 3G, a region where the p-type MOSFET is to be formed is masked by a resist 17. Thereafter, 30 keV $B^+$ions (for example) are implanted at a dose about $6\times10^{12}cm^{-2}$ into the region except for the masked portion thereby to adjust the threshold voltage of the n-type MOSFET.

Figure 3H:
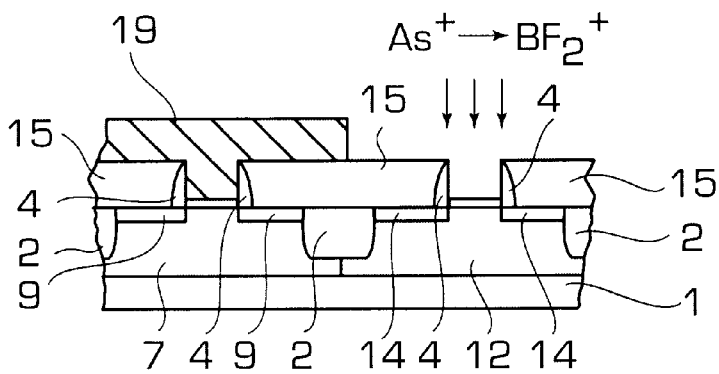

Following this, the resist 17 is removed, after which a region of the n-type MOSFET is masked by a resist 19 as shown in FIG. 3H. Thereafter, 100 KeV $As^+$ions (for example) are implanted at a dose about $7\times10^{12}$ $cm^{-2}$ into the region except for the masked portion. Subsequently, 15 keV $BF_2^+$ions (for example) are implanted in the same region at a dose about $1.5\times10^{13}cm^{-2}$ in order to adjust the threshold voltage of the p-type MOSFET.

Figure 3I:
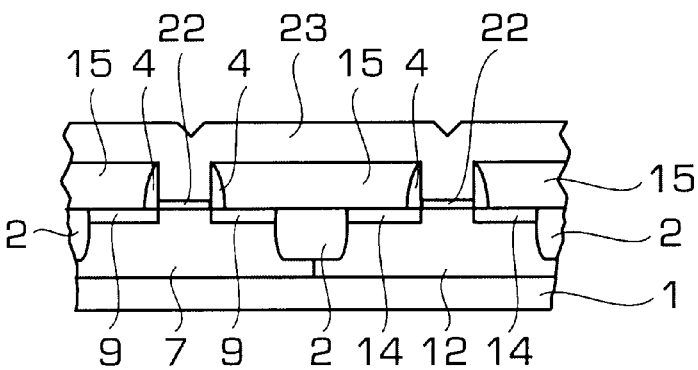

Then, the resist 19 is removed, after which each of the recesses 16 formed in the $SiO_2$ layer 15 is oxidized so as to form gate oxide layers 22 of about 6 nm on the bottom of the recesses 16 as shown in FIG. 3I. Thereafter, a polycrystalline silicon layer 23 with a thickness of about 400 nm is deposited on the entire surface of the structure using CVD technique, after which the polycrystalline silicon layer 23 is changed to $n^+$-type layer by diffusing phosphorus.

Figure 3J:
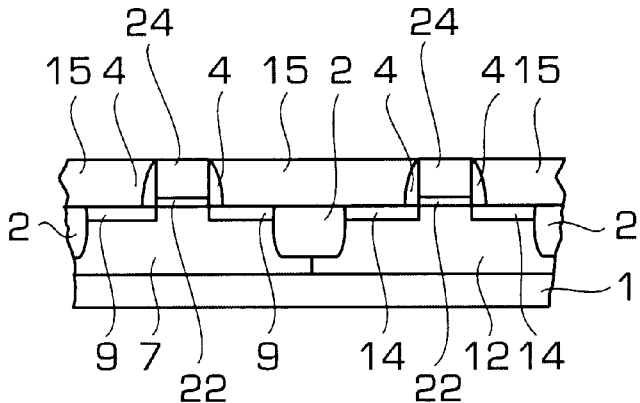

Thereafter, as shown in FIG. 3J, the surface of the structure of FIG. 3I is flattened, using chemical-mechanical polishing techniques, until the top surface of the $SiO_2$ layer 15 is exposed. Thus, gate electrodes 24 of polycrystalline silicon are formed. After these processes, although not shown, an inter-layer insulating film and electrodes are formed using processes well known in the art. Thus, a CMOFET according to the first embodiment is completed.

Figure 4A:
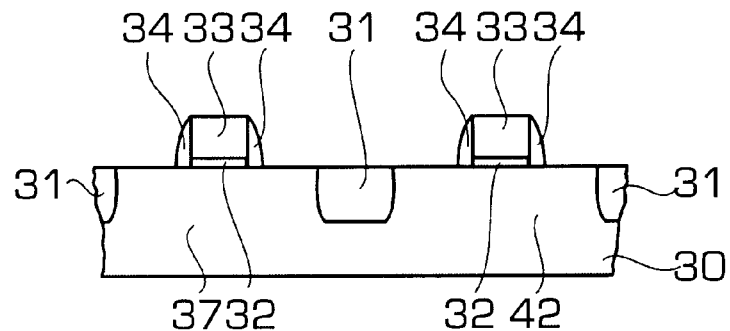
FIGS. 4A–4K are each a diagram showing a series of 1C device fabrication processes according to a second embodiment of the present invention.

A second preferred embodiment of the present invention will be described with reference to FIGS. 4A–4K. Principal differences between the first and second embodiments are as follows. That is, the second embodiment is provided with a dummy gate comprised of polycrystalline silicon 33 and a silicon nitride film 32, as shown in FIG. 4A. Further, the second embodiment uses a silicon nitride film 45 instead of the $SiO_2$ film 15.

As shown in FIG. 4A, a plurality of field oxide regions 31 are formed, on a <100>p-type silicon substrate 30 for segregation of adjacent elements. Thereafter, a silicon nitride film with a thickness of about 200 nm is formed on the silicon substrate 30 using a CVD (chemical vapor deposition) technique. Following this, a silicon nitride film with a thickness of about 10 nm and the a polycrystalline silicon film with a thickness of about 200 nm are deposited in this order on the substrate 30. Thereafter, using photolithography and etching, dummy gates, each of which consists of a silicon nitride film 32 and a polycrystalline silicon 33, are formed on the substrate 30. The dummy gate has a shape identical to that of a gate electrode to be formed at a later time. Thereafter. a $SiO_2$ layer is deposited on the entire surface and is subjected to anisotropic etching. Thus, sidewalls 34 are formed on the side surfaces of each dummy gate 4. The thickness of the sidewall 4 is about 70 nm at the base portion thereof.

Figure 4B:
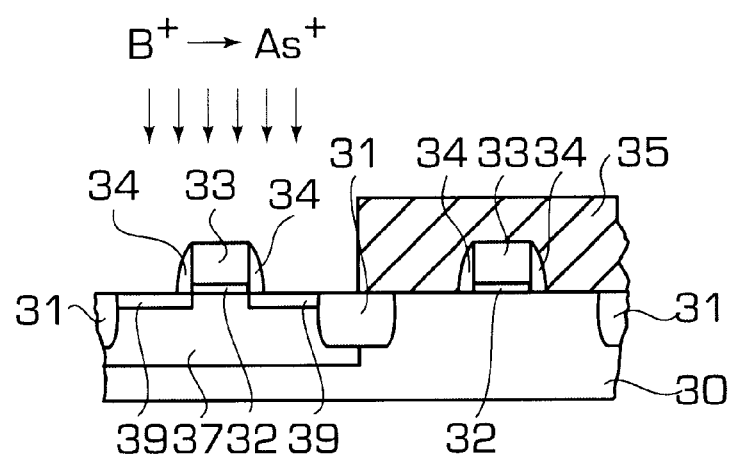

Subsequently, as shown in FIG. 4B, a region where p-type MOSFET is to be formed, is masked by a resist 35. Thereafter, 300 keV $B^+$ions (for example) are implanted at a dose about $2\times10^{13}cm^{-2}$ into the region except for the masked portion in order to form a type well 37. Following this, 30 keV $As^+$ions (for example) are implanted at a dose about $3\times10^{15}cm^{-2}$ into the same region, and thus forms a $n^+$-type source and drain region 39.

Following this, after the resist 35 is removed, a region where n-type MOSFET is to be formed is masked by a resist 40. Thereafter, 700 keV $P^+$ions (for example) are implanted at a dose about $1.5\times10^{13}cm^{-2}$ into the region except for the masked portion in order to form a n-type well 42. Subsequently, 20 keV $BF_2^+$ions (for example) are implanted at a dose about $3\times10^{15}cm^{-2}$ into the same region, forming a n-type source and drain region 44. Subsequently, the resist 40 is removed, after which the substrate 30 is annealed at 1000° C. for about 10 seconds in an atmosphere of nitrogen for activating the $n^+$-type source and drain region 39 as well as the $p^+$-type source and drain region 44. By this annealing, point defects in interstitial sites in the source and drain regions are eliminated.

Figure 4C:
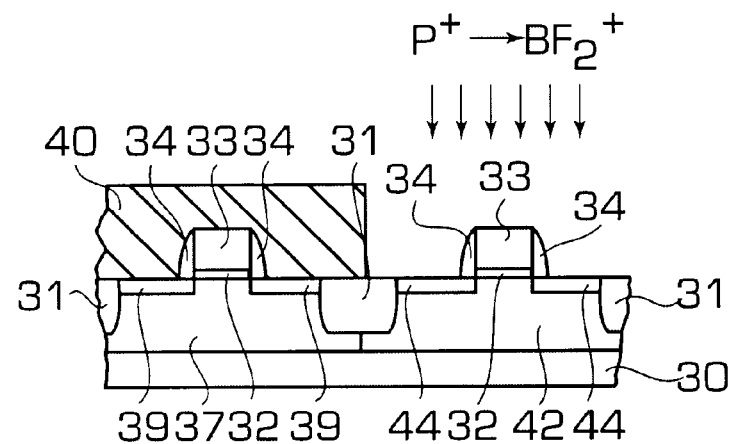
Figure 4D:
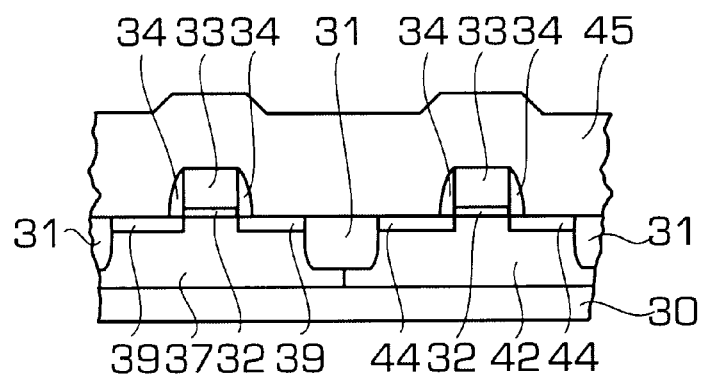
Figure 4E:
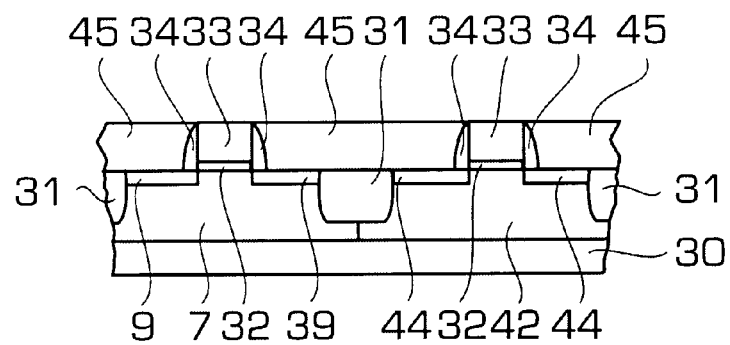

Subsequently, as shown in FIG. 4D, the entire surface of the structure of FIG. 4C is covered with a silicon nitride film 45 having a thickness of about 400 nm using CVD technique. Thereafter, as shown in FIG. 4E, the surface of the structure of FIG. 4D is flattened, using chemical-mechanical polishing techniques, until the top surface of each of the polycrystalline silicon film 33 (viz., part of the dummy) is exposed.

The reason why the silicon nitride film 45 is used in the second embodiment is that the film 45 is etched at a higher rate compared to the field oxide region 31. More specifically, when the film 45 is etched in a later process (FIG. 4K), the etch rate of the film 45 should be higher than that of the field oxide region 31 in order to leave the oxide region 31.

Figure 4F:
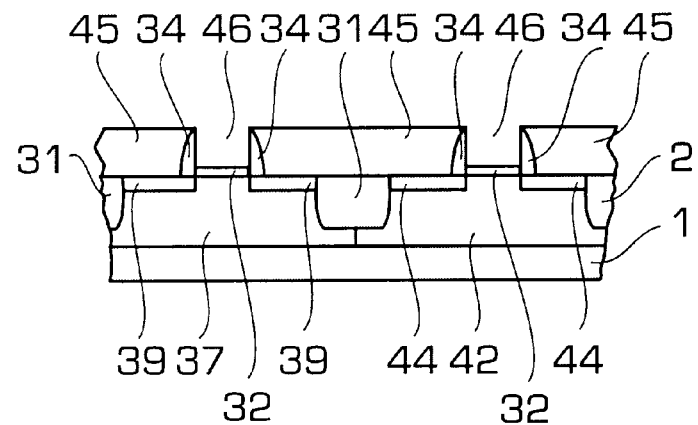

Thereafter, as shown in FIG. 4F, the polycrystalline silicon regions 33 of each dummy gate are etched, whereby recesses 46 are formed in which gate electrodes are to deposited at a later process, respectively. It is to be noted that the silicon nitride layer 32 is left on the bottom of each recess 46.

Figure 4G:
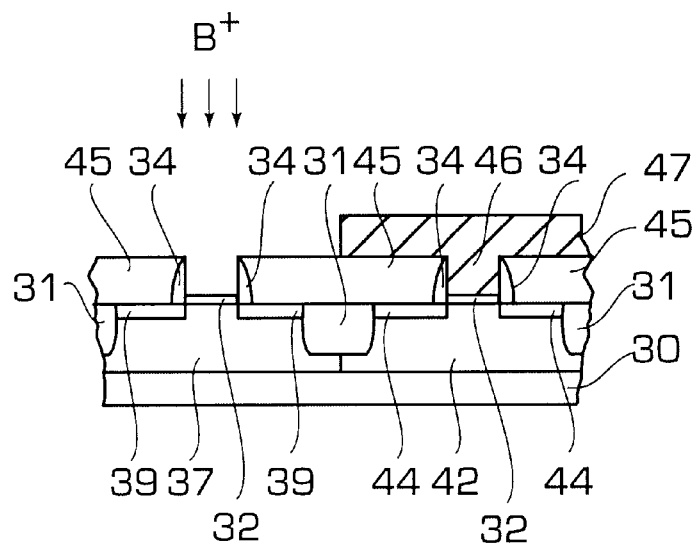

Following this, as shown in FIG. 4G, a region where the p-type MOSFET is to be formed is masked by a resist 47. Thereafter, 30 keV $B^+$ions (for example) are implanted at a dose about $6\times10^{12}cm^{-2}$ into the region except for the masked portion thereby to adjust the threshold voltage of the n-type MOSFET.

Figure 4H:
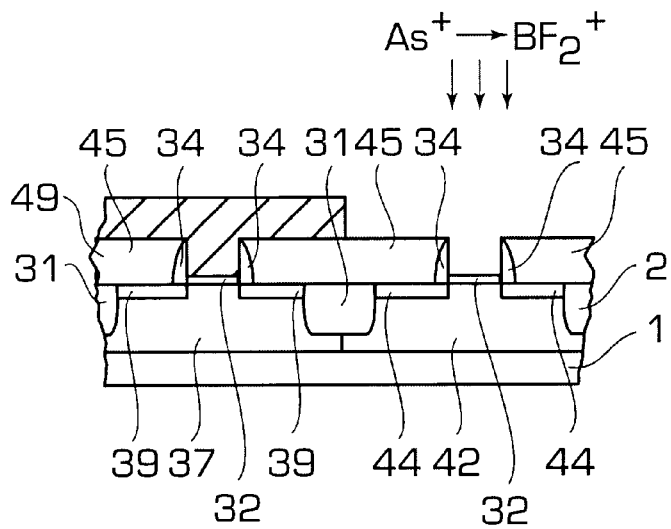

Following this, the resist 47 is removed, after which a region of the n-type MOSFET is masked by a resist 49 as shown in FIG. 4H. Thereafter, 100 keV $As^+$ions (for example) are implanted at a dose about $7\times10^{12}cm^{-2}$ into the region except for the masked portion. Subsequently, 15 keV $BF_2^+$ions (for example) are implanted in the same region at a dose about $1.5\times10^{13}cm^{-2}$ in order to adjust the threshold voltage of the p-type MOSFET.

Figure 4I:
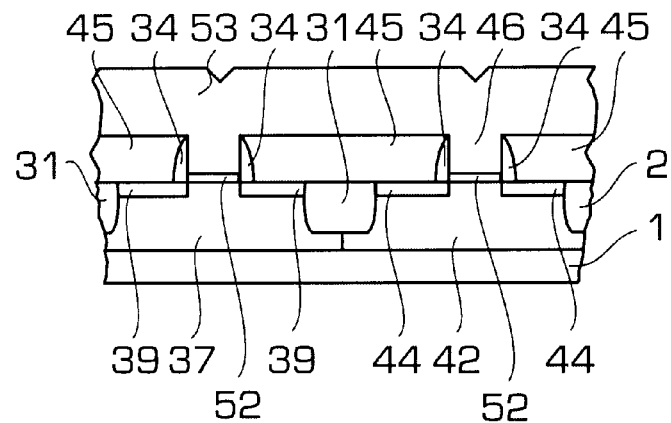

Then, the silicon nitride films 32 (about 10 nm in thickness) are removed by etching using phosphorus. In this instance, although the silicon nitride film 45 is also etched, the thickness of this film is about 210 nm and thus it is possible to leave the silicon nitride film 45. By the way, the sidewalls 34 are made of $SiO_2$ and are not etched during the above etching process. Thereafter, each of the recesses 16 formed in the $SiO_2$ layer 15 is oxidized so as to form gate oxide layers 52 of about 6 nm on the bottom of the recesses 16, as shown in FIG. 4I. Thereafter, a polycrystalline silicon layer 53 with a thickness of about 400 nm is deposited on the entire surface of the structure using CVD technique, after which the polycrystalline silicon layer 53 is changed to $n^+$-type layer by diffusing phosphorus.

Figure 4J:
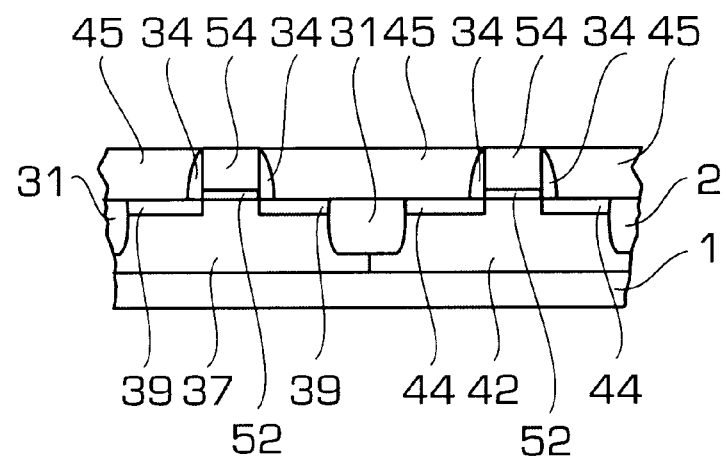

Thereafter, as shown in FIG. 4J, the surface of the structure of FIG. 4I is flattened, using chemical-mechanical polishing techniques, until the top surface of the silicon nitride film 45 above the source and drain regions is exposed. Thus, gate electrodes 54 of polycrystalline silicon are formed.

Figure 4K:
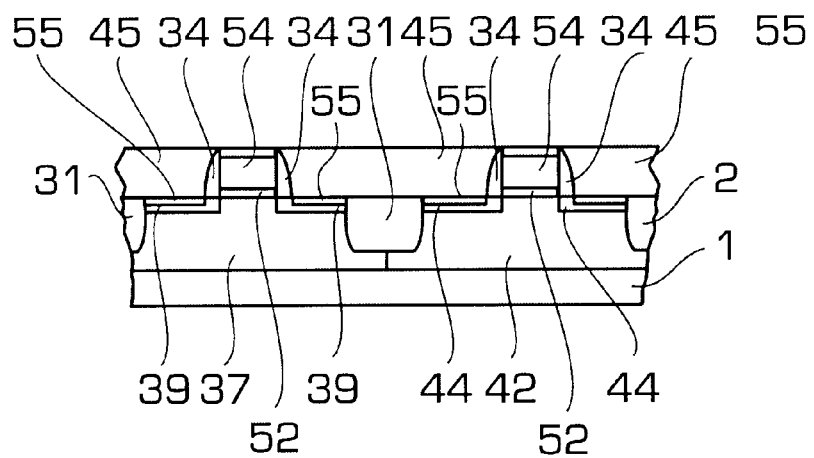

After these processes, as shown in FIG. 4K, the silicon nitride films 45 over the source and drain regions are removed by etching using phosphorus. Therefore, the sidewalls 34 of $SiO_2$ are left on the side surfaces of each of the polycrystalline silicon gates 54. Thereafter, silicide layers 55 are formed on the source-drain and gate regions by sputtering Ti or CO. Although not shown, an inter-layer insulating film and electrodes are formed using processes well known in the art. Thus, a CMOFET according to the second embodiment is completed.

It will be understood that the above disclosure is representative of only two possible embodiments of the present invention and that the concept on which the invention is based is not specifically limited thereto.

What is claimed is:

1. A method of fabricating a semiconductor device, comprising the steps of:

(a) forming a plurality of element segregation regions of dielectric material on a first conductive type semiconductor substrate;

(b) forming a plurality of dummy gates, in selective regions on the substrate, wherein gate electrodes are to be formed, respectively;

(c) masking, by a first resist, regions wherein first conductive type elements are to be formed;

(d) forming a first conductive type well by ion implanting a first conductive type impurity in regions which are not masked by said first resist;

(e) forming a second conductive type source and drain region by ion implanting a second conductive type impurity in the regions which are not masked by the first resist;

(f) removing the first resist covering the regions wherein the first conductive type elements are to be formed;

(g) masking, by a second resist, regions wherein second conductive type elements are to be formed;

(h) forming a second conductive type well by ion implanting a second conductive type impurity in regions which are not masked by the second resist;

(i) forming a first conductive type source and drain region by ion implanting a first conductive type impurity in the regions which are not masked by the second resist;

(j) removing the second resist covering the regions wherein the second conductive type elements are to be formed;

(k) activating the source and drain regions;

(l) forming a first layer on the substrate;

(m) polishing the first layer until the surface of each of the dummy gates is exposed;

(n) removing the dummy gates;

(o) masking, by a third resist, regions wherein the first conductive type elements are to be formed;

(p) ion implanting a first conductive type impurity;

(q) removing the third resist covering the regions wherein the first conductive type elements are to be formed;

(r) masking, by a fourth resist, regions wherein the second conductive type elements are to be formed;

(s) ion implanting a second conductive type impurity;

(t) removing the fourth resist covering the regions wherein the second conductive type elements are to be formed;

(u) forming a gate oxide layer in each recess left by removing the dummy gate in step (n);

(v) covering the substrate with a gate electrode material; and (w) polishing the gate electrode material covering the substrate at step (v) until the first layer is exposed.

2. A method as claimed in claim 1, wherein the first layer is made of a material which is different from a material of the dummy gates.

3. A method as claimed in claim 1, wherein the first layer has a higher etching rate relative to the dummy gates.

4. A method as claimed in claim 1, wherein the first layer is made of a dielectric material.

5. A method as claimed in claim 1, where the first layer is made of a material which is different from a material of each of the element segregation regions.

6. A method as claimed in claim 1, wherein the dummy gate has a higher etching rate relative to the substrate.

7. A method as claimed in claim 1, wherein the dummy gates have a sidewall on side surfaces thereof.

8. A method as claimed in claim 7, wherein the first layer is removed.

9. A method as claimed in claim 7, wherein the first layer has a higher etching rate relative to the element segregation regions.

10. A method as claimed in claim 8, wherein the sidewall is made of a dielectric material.

11. A method as claimed in claim 8, wherein the sidewall is made of a material different from a material of the dummy gates.

12. A method as claimed in claim 8, wherein the sidewall has a higher etching rate relative to the dummy gates.

13. A method as claimed in claim 8, wherein the sidewall is made of a material different from a material of the first layer.

14. A method as claimed in claim 8, wherein the sidewall has a higher etching rate relative to the fist layer.

15. A method of fabricating a semiconductor device having a substrate, comprising the steps of:

(a) forming a plurality of dummy gates, in selective regions on the substrate, wherein gate electrodes are to be formed, respectively;

(b) covering, by a first resist mask, regions distinct from a plurality of element forming regions including the regions for forming the dummy gates;

(c) forming a first conductive type well by ion implanting a first conductive type impurity in the element forming regions using the first resist mask;

(d) forming a second conductive type source and drain region by ion implanting a second conductive type impurity in the element forming regions using the first resist mask;

(e) removing the first resist mask;

(f) activating the source and drain regions;

(g) forming a first layer on the substrate;

(h) polishing the first layer until the surface of each of the dummy gates is exposed;

(i) removing the dummy gates;

(j) covering, by a second mask, the regions distinct from the element forming regions;

(k) ion implanting a second conductive type impurity in channel regions of the element forming regions;

(l) removing the second resist mask;

(m) forming a gate oxide layer in each recess left by removing the dummy gates;

(n) forming gate electrodes on the semiconductor substrate.

16. The method of claim 15, wherein the first layer is made of a material that is different from a material of the dummy gates.

17. The method of claim 15, wherein the first layer has a higher etching rate relative to the dummy gates.

18. The method of claim 15, wherein the first layer is made of a dielectric material.

19. The method of claim 15, wherein the dummy gates have a higher etching rate relative to the substrate.

20. The method of claim 15, wherein the dummy gate has a sidewall on the side surfaces thereof.

21. The method of claim 20, wherein the first layer is removed.

22. The method of claim 21, wherein the sidewall is made of a dielectric material.

23. The method of claim 21, wherein the sidewall is made of a material different form a material of the dummy gate.

24. The method of claim 21, wherein the sidewall has a higher etching rate relative to the dummy gates.

25. The method of claim 21, wherein the sidewall is made of a material different form a material of the first layer.

26. The method of claim 21, wherein the sidewall has a higher etching rate relative to the first layer.

* * * * *